United States Patent [19]
Feldman et al.

[11] Patent Number: 5,308,796
[45] Date of Patent: May 3, 1994

[54] FABRICATION OF ELECTRONIC DEVICES BY ELECTROLESS PLATING OF COPPER ONTO A METAL SILICIDE

[75] Inventors: Leonard C. Feldman, Berkeley Heights; Gregg S. Higashi, Basking Ridge; Cecilia Y. Mak, Bedminster; Barry Miller, Murray Hill, all of N.J.

[73] Assignee: AT&T Bell Laboratories, Murray Hill, N.J.

[21] Appl. No.: 53,840

[22] Filed: Apr. 27, 1993

Related U.S. Application Data

[63] Continuation of Ser. No. 768,503, Sep. 30, 1991, abandoned.

[51] Int. Cl.⁵ .......................................... H01L 21/441
[52] U.S. Cl. ................................. 437/200; 437/230; 427/98
[58] Field of Search ................... 437/200, 230; 427/98

[56] References Cited

U.S. PATENT DOCUMENTS

| | | | |
|---|---|---|---|
| 4,619,887 | 10/1986 | Hooper et al. | 156/642 X |
| 4,692,349 | 9/1980 | Georgiou et al. | 437/230 |
| 5,008,217 | 4/1991 | Case et al. | |
| 5,019,531 | 5/1991 | Awaya | 437/180 |

FOREIGN PATENT DOCUMENTS 0236034  9/1987  European Pat. Off. .

OTHER PUBLICATIONS

Iwamatsuu Seiichi, "Multilayer Interconnection Structure," Patent Abstracts of Japan, vol. 013490, Publ. No. JP1196143, (Aug. 7, 1989).

A. K. Datta, et al., "Characteristics of Metal-Semiconductor Contacts Fabricated by the Electroless Deposition Method," *Solid State Electronics*, 23(8), pp. 905-907 (Aug. 1980), Oxford, England.

Madokoro Shoji, "Manufacture of Semiconductor Integrated Circuit Device," Patent Abstracts of Japan, vol. 012217, Publ. No. JP63012155, (Jan. 19, 1988).

C. Y. Mak, et al., "Selective electroless copper metallization with palladium silicide on silicon substrates," *Applied Physics Letters*, 59(26), pp. 3449-3451 (Dec. 23, 1991).

*Primary Examiner*—John S. Maples
*Attorney, Agent, or Firm*—Richard J. Botos; Bruce S. Schneider

[57] ABSTRACT

It has been found that selective metallization in integrated circuits is expeditiously achieved through a copper plating procedure. In this process, palladium silicide is used as a catalytic surface and an electroless plating bath is employed to introduce copper plating only in regions where the silicide is present. Use of this procedure yields superior filling of vias and windows with excellent conductivity.

9 Claims, 4 Drawing Sheets

FABRICATION OF ELECTRONIC DEVICES BY ELECTROLESS PLATING OF COPPER ONTO A METAL SILICIDE

This application is a continuation of application Ser. No. 07/768503, filed on Sep. 30, 1991, now abandoned.

BACKGROUND OF THE INVENTION

1. Field of the Invention

This invention relates to fabrication of integrated circuits and, in particular, to the fabrication of integrated circuits involving conductive regions.

2. Art Background

In the fabrication of integrated circuits, generally multiple layers of material are formed and electrical interconnects are made between these layers. These interconnects are generally formed by etching a via or window through an intermediate layer, e.g., a dielectric layer, and filling the conduit with a metallic material to establish a conduction path. An electrically conductive pattern produced on the overlying layer then provides the desired electrical circuit connection to regions in the underlying layer.

At design rules less than 0.5 micron, the aspect ratio of the via or window defining the interconnects is generally greater than 3 and often as high as 5 to 10. (Aspect ratio is the ratio of height to width of the opening defining the interconnect.) For such high aspect ratios, it is often a challenge to fill the via completely with the metallization material and to assure good electrical continuity between the adjoining conducting layers. Seams and voids resulting from poor filling not only yield a high via resistance but also invite entrapment of contaminants in subsequent processing steps that, in turn, often lead to reliability problems. To avoid gaps and the attendant problems, chemical vapor deposition (CVD) procedures are typically employed. Since CVD occurs at a surface from a gas, filling of high aspect ratio interconnects is possible. However, CVD for metals such as aluminum involves many difficulties and often requires significant care. (See U.S. Pat. No. 5,008,217, dated Apr. 16, 1991.) Use of directional sputtering has also been investigated but is extremely difficult to control, especially at small dimensions and high aspect ratios.

Sometimes, it is also desirable that the interconnects be filled during formation of the metal pattern on the overlying layer. In this case, pattern forming is generally accomplished by blanket deposition to fill the interconnects and to produce an overlying layer of metal, with subsequent delineation of this layer by etching through a photolithography defined mask.

Although aluminum metallization patterns together with aluminum or refractive metal interconnects have almost uniformly been employed in integrated circuit devices for strict design rules, i.e., less than 0.5 micron, at such design rules the time delay in the circuit attributed to the delay in the interconnects becomes a significant factor. To reduce this delay, use of copper with its lower electrical resistivity has been proposed. (The specific resistivity of pure copper is 1.7 microohm-cm, that for aluminum is 2.8, and 3.3 is typical for copper-containing aluminum alloys presently used for VLSI metallization.) Metallization with a copper material, i.e., a material of at least 90 mole percent copper also offers other advantages. With smaller device dimensions, concomitant current density increase in the narrowed aluminum conductors often engenders reliability problems due to electromigration, i.e. distortion of the lines in the pattern. Copper appears to be less susceptible to such problems.

However, implementation of copper metallization for submicron device fabrication has been extremely difficult. Copper has a tendency to diffuse into silicon and silicon dioxide. The adhesion of copper is known to be notoriously poor. It is also extremely difficult to etch copper to produce desired fine line (0.5 $\mu$m or finer) circuit patterns. Comparable procedures such as chemical vapor deposition for depositing copper suffer many complications relating to selectivity and processing temperatures. Therefore, although use of copper in the metallization of integrated circuits might be theoretically desirable for shrinking design rules, suitable means are still lacking.

SUMMARY OF THE INVENTION

By utilizing an electroless deposition procedure, high aspect ratio interconnects or channels are filled with copper to produce a low resistance via, window, and/or runner. The process proceeds at relatively low temperatures, e.g. 42° C. Additionally, by a selective etching procedure prior to the electroless deposition step, it is possible to deposit copper selectively only on desired areas to produce the interconnects and circuit patterns, thus eliminating the need for a copper etching step.

The deposition process involves formation of a silicide, such as palladium silicide (in the absence of an overlying passivating material, e.g., substantial silicon or its oxides), in the region upon which copper deposition is desired. The silicide such as palladium silicide acts as a catalyst to initiate reduction of copper ions from an electroless plating bath to produce an acceptably low resistance copper deposition. Thus, for example, in the case of producing an interconnect involving a silicon region at the bottom of the interconnect defined through a silicon dioxide region, palladium is first evaporated over the entire surface and is heated to form palladium silicide only at the base of the via structure. The palladium on the silicon dioxide surface is unreacted. A selective etch is then used to remove the unreacted surface palladium. Upon substrate immersion in a conventional electroless copper plating bath, copper deposition proceeds selectively on the palladium silicide surfaces and continues up through the interconnect. The silicon dioxide surface is non-catalytic to the plating step and induces essentially no copper deposition.

DETAILED DESCRIPTION

Figure 1:
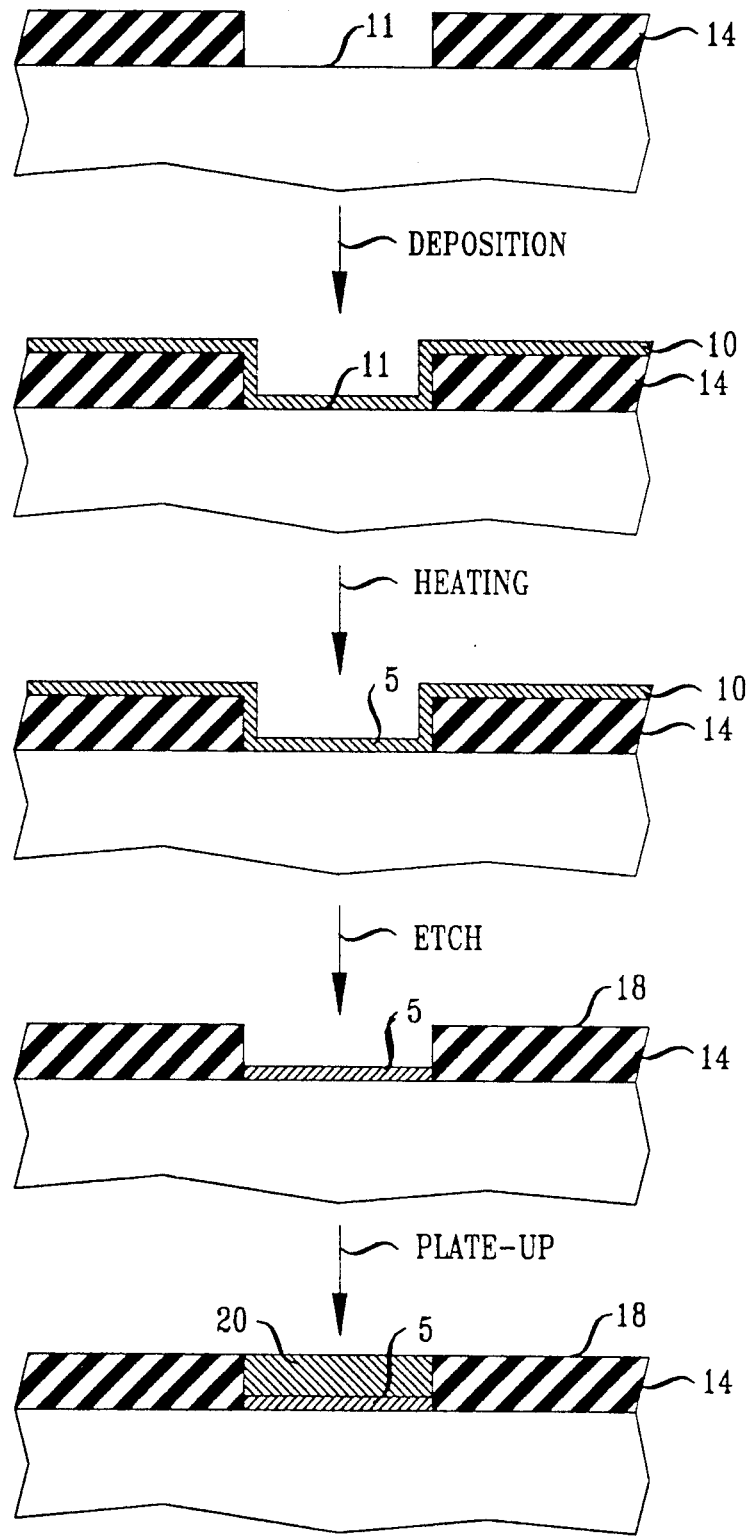
FIG. 1 is illustrative of the inventive process.

As discussed, the invention involves the production of interconnects and overlying electrically conductive patterns of copper through a plating, e.g. electroless plating, procedure. In the electroless plating procedure, the regions to be plated should have the desired silicide, e.g. palladium silicide, at their surfaces. The amount of silicide necessary at the surface region should be, on average, at least one monolayer. Quantities less than one monolayer do not induce a suitably uniform deposition of copper. Although the amount of silicide above this limit is not critical, generally thicknesses up to one micron are useful. Thicknesses greater than one micron, although not precluded, do not enhance the properties of the desired copper deposition, and tend to increase the overall resistance of the interconnect.

The method of silicide formation is not critical. However, silicides such as palladium silicide are conveniently formed by depositing elemental metal, 10, e.g. palladium, on a silicon surface 11 through an opening in a layer 14 such as a dielectric layer, and heating this interface to a temperature in the range of 200° to 300° C. Generally, processes such as sputtering and evaporation are advantageously employed to deposit the elemental metal at the bottom of interconnects, even at an aspect ratio up to 10. The heating induces interaction between the metal and the silicon to form the silicide 5. Complete conversion of the palladium to silicide is desirable but not required. It is possible during etching to remove unconverted palladium overlying the silicide. For application such as multi-level interconnections or incorporating diffusion barriers, a polysilicon layer is used to form the base silicon layer. In this case, however, complete conversion of the silicon to silicide is desirable to maintain a low minimum interconnect resistance.

Once the desired silicide is formed, elemental metal 10 is removed in regions where copper deposit is not desired. This removal as shown at 18 is accomplished, for example, through an etch that removes the elemental metal while leaving sufficient palladium silicide to induce the desired copper plating. Exemplary of such an etchant for palladium is ten parts by volume concentrated nitric acid, one part concentrated hydrochloric acid and ten parts glacial acetic acid. The remaining silicide is then subjected to plating such as an electroless plating bath to yield copper region 20 over silicide 5.

The exact chemical constituents of the electroless plating bath are not critical and conventional baths such as MACu Dep 54 from MacDermid, Inc. are usefully employed. Typically, the electroless copper bath includes a reducing agent such as formaldehyde to supply electrons for copper ion reduction to the elemental state and additives for controlling the bath stability and the physical properties of the copper. These additives are well known and are discussed in compendiums such as Electroless Plating: Fundamentals and Application, G. O. Mallory and J. B. Hajdu, Ed., AES, Orlando, Fla., 1990.

Figure 2:
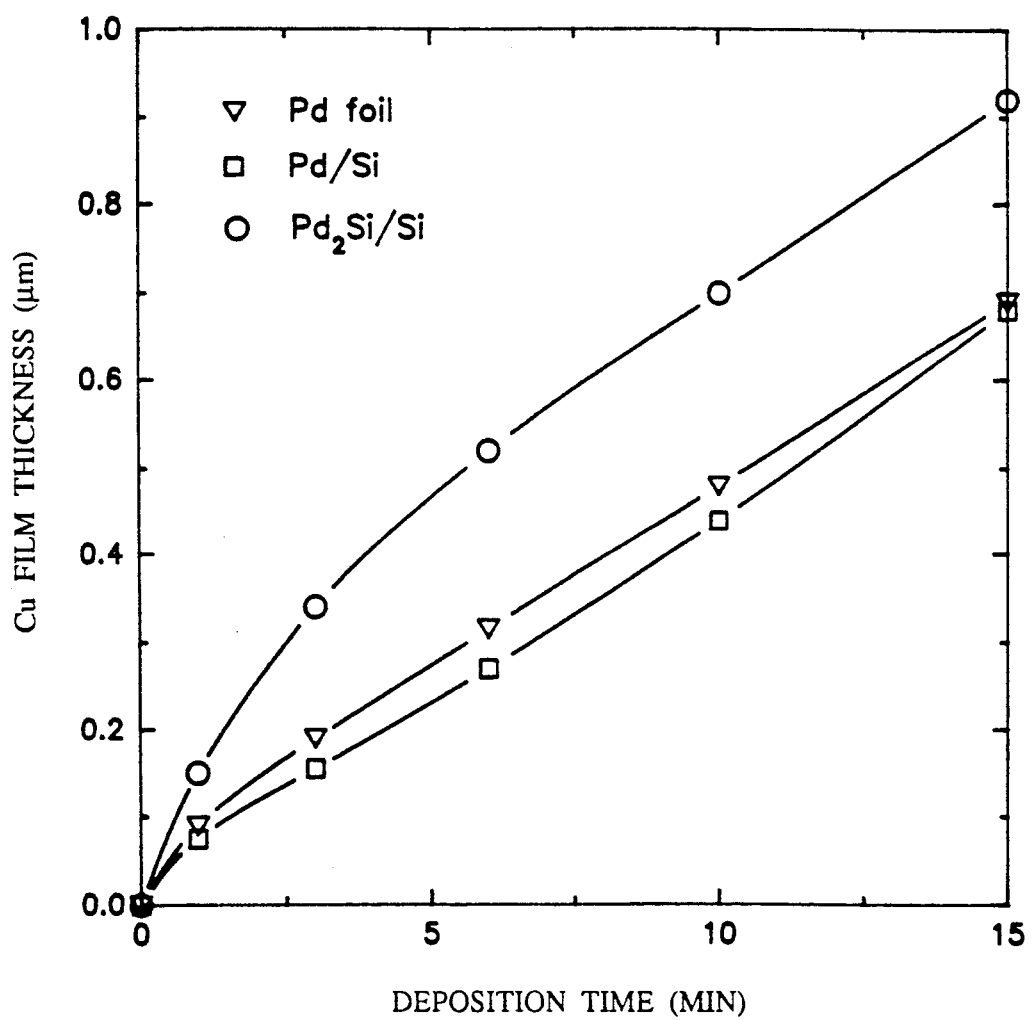
FIGS. 2 through 4 are illustrative of properties associated with this process
Figure 3:
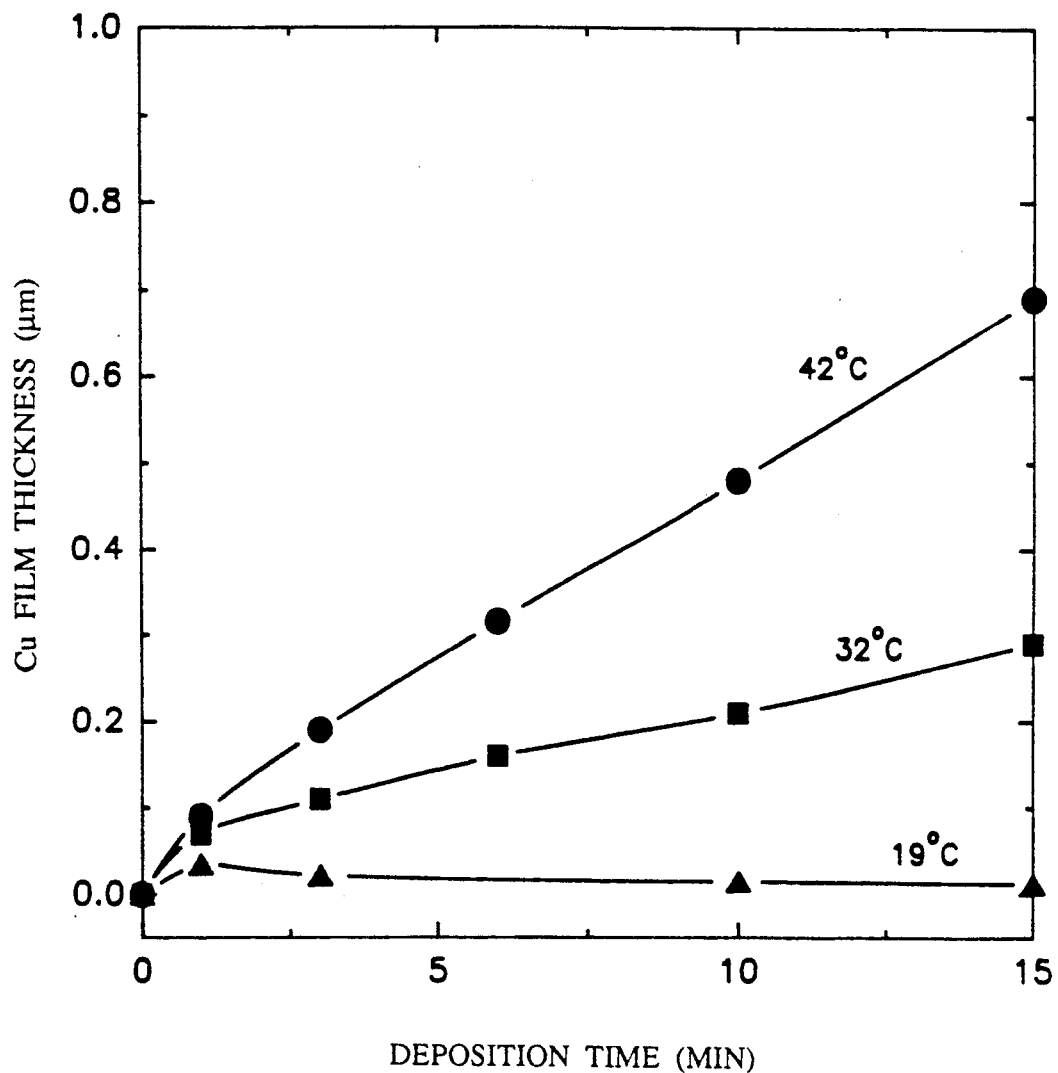

The rate of copper formation for a given bath is most readily controlled by the temperature at which the plating is performed. FIG. 3 shows typical rates of copper deposition on palladium surfaces as a function of temperature for the MACu Dep 54 bath. (FIG. 2 shows a comparison of deposition rate produced by palladium silicide as compared to palladium metal.) Generally, for this bath process, temperatures in the range 30° to 50° C. are used since temperatures less than 30° C. cause undesirably slow plating, while temperatures above 50° C. lead to spontaneous decomposition and non-selective deposition of copper. The exact temperature range useful for a specific bath composition is easily determined through use of a control sample.

As discussed, plating occurs only on the silicide or on the evolving copper deposition. Plating does not occur on adjoining regions such as regions including silicon dioxide that have been etched as described to remove the unreacted metal, e.g., palladium, or on underlying regions, e.g. silicon, that have not been exposed to the metal. (Rutherford backscattering (RBS) examination of the etched silicon dioxide surfaces shows less than 0.01 monolayer of copper is present, i.e., less than the detection limit of RBS.).

The resulting copper deposition in the interconnect generally has a resistivity about 2.0 microohm-cm, close to the theoretical value for bulk copper, 1.7 microohm-cm. Qualitative scotch tape adhesion test indicates that the copper on the palladium silicide has acceptable mechanical adhesion to the base substrates. Contactless photocarrier decay measurements of silicon lifetime show little loss due to the exposure in an electroless copper plating bath. For example, a $SiO_2$ covered region had a lifetime of 440 $\mu$s before, and 390 $\mu$s after 15 minutes of electroless bath exposure at 42° C., which is very acceptable for VLSI technology.

Modification of the copper properties, by introduction of other materials into the copper through processes such as ion implantation or deposition of a plurality of materials, is acceptable. As discussed, use of silicide other than palladium silicide is acceptable. Generally, if the unoxidized metal corresponding to the metal silicide provides sufficient catalytic activation, so will its silicide, provided its surface is not passivated. For example, platinum silicide is acceptable if surface oxides produced during the formation are removed by, for example, etching with materials such as hydrofluoric acid. For these reasons, untreated silicides of tantalum, titanium, and cobalt are not suitable for baths based on reduction of copper ions by formaldehyde. However, such silicides are not precluded in conjunction with baths having reduction chemistry for which the silicides are a catalyst. Furthermore, these silicides are not precluded if their surfaces also contain sufficient palladium silicide or other activation catalyst to initiate the copper plating.

The following examples are illustrative of processing conditions involved in the invention.

EXAMPLE 1

A silicon wafer having a 3 $\mu$m thick layer of silicon dioxide was patterned using conventional lithographic and etch technology to form 0.5 $\mu$m to 4 $\mu$m windows and used as the test sample. Five hundred angstroms of palladium was evaporated over the entire surface. The sample was heated to 250° C. for 2 hours at a pressure of $10^{-8}$ torr, to form palladium silicide at the bottom of the windows.

The etchant, which consists of 10 parts by volume nitric acid, 10 parts acetic acid and 1 part hydrochloric acid was combined and allowed to react for at least two hours before use. The etchant was mixed with a magnetic stirrer during this standing period. (The standing time seemed to enhance subsequent deposition of an adherent film although the effect on palladium removal is not dependent on this factor.).

The annealed palladium coated sample was immersed in the etchant to remove the unreacted palladium on the silicon dioxide surfaces. The etched sample was immediately rinsed sequentially with distilled water and methanol and dried under a nitrogen stream. The sample was then immersed for 45 minutes in the electroless copper bath for copper deposition. (The bath was MACu Dep 54 at 42° C.).

With Rutherford back scattering measurements, it was found that all the unreacted palladium on the silicon dioxide dissolved in the etchant within 1 minute of treatment. The palladium content on the palladium silicide was not substantially attacked for about 3 minutes. (Five minute treatment in the etchant was found to reduce the original 500 Å total palladium content to approximately 6 Å. However, even with this small amount of palladium silicide present, copper deposition proceeded effectively.) As a comparison, silicon samples covered with unannealed palladium and etched as described above did not have the necessary catalytic activity to initiate copper deposition in the electroless bath.

EXAMPLE 2

Figure 4:
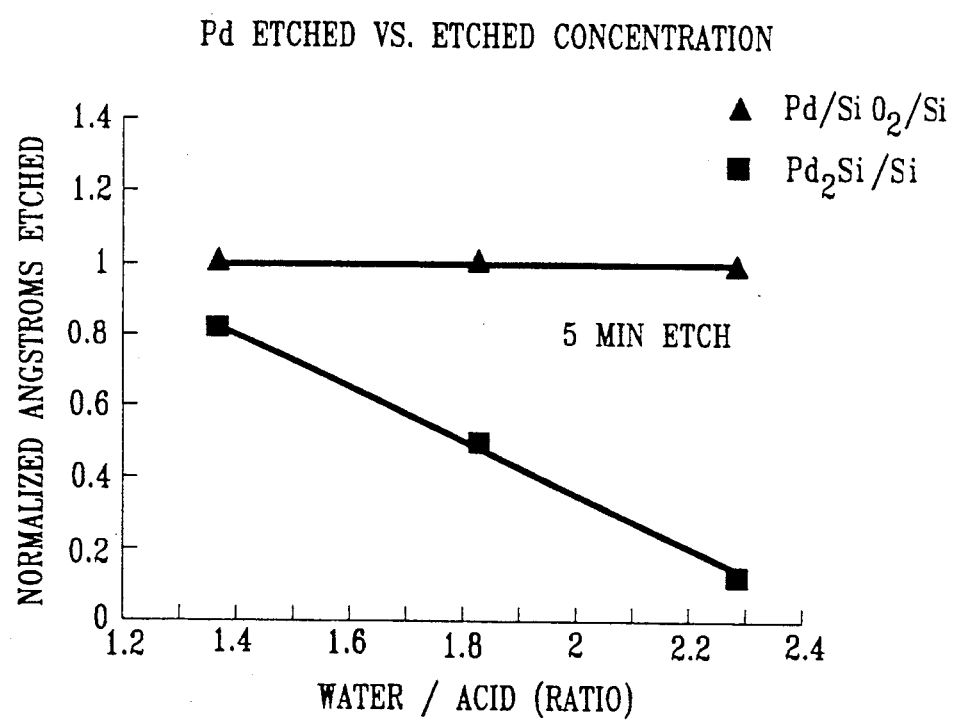

Portions of the acetic acid in the etchant were replaced with water. FIG. 4 shows the etch rate following the procedure of Example 1 for various etchant compositions. Appropriate dilution allows a more convenient operating window for selective removal of unreacted palladium.

We claim:

1. A process for fabricating a device comprising the steps of forming a layer on a substrate, forming an opening through said layer to said substrate, forming a region of metal silicide on said substrate in the region positioned at the bottom of said opening and plating copper material onto said silicide using an electroless plating bath.

2. The process of claim 1 wherein said metal silicide comprises platinum or palladium silicide.

3. The process of claim 1 wherein said layer comprises a dielectric material.

4. The process of claim 3 wherein said dielectric comprises silicon dioxide.

5. The process of claim 1 wherein said substrate comprises an integrated circuit being processed.

6. The process of claim 1 wherein said silicide is found by deposition of said metal onto said layer and into said opening, and wherein said region comprises silicon.

7. The process of claim 6 wherein said metal on said layer is removed before said plating.

8. The process of claim 7 wherein said removal comprises etching.

9. The process of claim 1 wherein said bath comprises formaldehyde and a source of copper ions.

* * * * *